(12) United States Patent
Williamson

(10) Patent No.: US 6,538,525 B1
(45) Date of Patent: Mar. 25, 2003

(54) VOLTAGE BIASED SECTION OF NON-LINEAR TRANSMISSION LINE

(75) Inventor: John Williamson, Herts (GB)

(73) Assignee: Nortel Networks Limited, St. Laurent (CA)

(*) Notice: Subject to any disclaimer, the term of this patent is extended or adjusted under 35 U.S.C. 154(b) by 64 days.

(21) Appl. No.: 09/741,257

(22) Filed: Dec. 19, 2000

(51) Int. Cl.[7] ................................................. H03K 3/36
(52) U.S. Cl. ........................... 333/20; 307/106; 327/181
(58) Field of Search .......................... 333/20; 307/106; 327/100, 101, 181, 184, 103, 126, 330, 333

(56) References Cited

U.S. PATENT DOCUMENTS

| | | | |
|---|---|---|---|
| 3,983,416 A * | 9/1976 | Gronson ..................... | 307/260 |
| 4,425,515 A * | 1/1984 | Larson ........................ | 307/268 |
| 4,855,696 A * | 8/1989 | Tan et al. .................... | 333/20 |
| 5,014,018 A * | 5/1991 | Rodwell et al. ............. | 333/20 |
| 5,047,829 A * | 9/1991 | Seymour et al. ............. | 357/58 |
| 5,455,523 A * | 10/1995 | Wallace et al. .............. | 326/30 |
| 5,789,994 A * | 8/1998 | Case et al. ................... | 333/20 |
| 5,804,921 A * | 9/1998 | McEwan ..................... | 315/20 |
| 6,111,476 A | 8/2000 | Williamson ................. | 333/109 |
| 6,239,637 B1 * | 5/2001 | Williamson ................. | 327/170 |
| 2001/0001536 A1 * | 5/2001 | Maddala et al. ........... | 324/72.5 |

* cited by examiner

Primary Examiner—Barbara Summons
(74) Attorney, Agent, or Firm—Barnes & Thornburg

(57) ABSTRACT

The principal reason that commercially available 10 gigabits per second electrical interconnect has not previously been available is that such interconnect structures possess too high a level of parasitic inductance, capacitance, resistance and conductance. These result in signal degradation as a result of attenuation, harmonic distortion and dispersion and so sufficiently error-free transmission of data has been virtually impossible for high data rates such as those around 5 gigabits per second and above. By providing compensation mechanisms, signal integrity is improved thus enabling reliable data transmission at data rates of 5 gigabits per second, 10 gigabits per second and above. Non-linear transmission lines are used to form these compensation mechanisms. The non-linear transmission line may take the form of a distributed diode, for example, formed from a layer of N-doped silicon covered on its top surface by a layer of platinum and on its bottom surface by a layer of silicon dioxide. Advantageously, voltage biased sections of NLTL are used to perform compensation for different regions of a signal pulse according to the particular voltage biasing used. A plurality of such voltage biased sections of NLTL may be connected in series in order to obtain improved signal compensation.

19 Claims, 15 Drawing Sheets

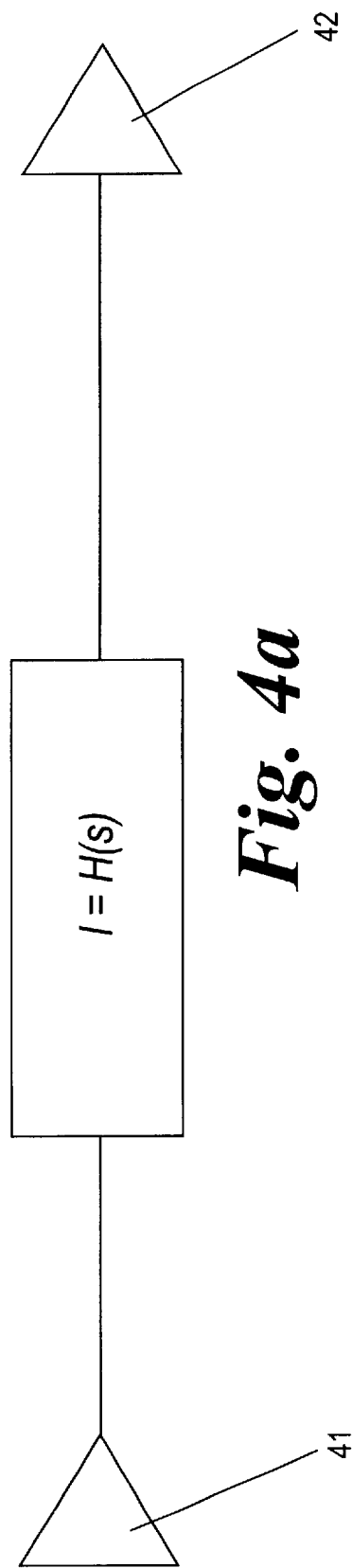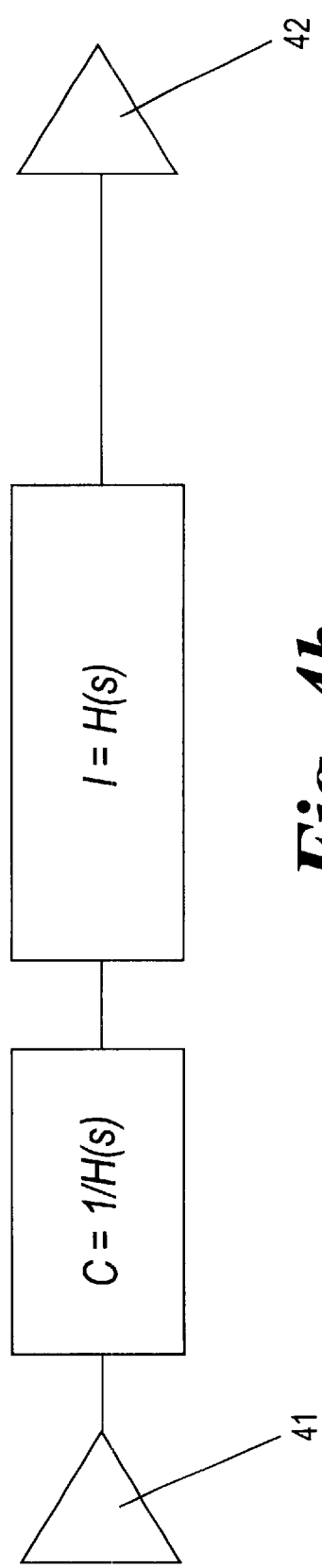
A) Standard interconnect with frequency response $H(s)$
*Fig. 4a*
B) Compensated interconnect with active compensation $C$
*Fig. 4b*

VOLTAGE BIASED SECTION OF NON-LINEAR TRANSMISSION LINE

FIELD OF THE INVENTION

The present invention relates to voltage biased sections of non-linear transmission lines. The invention is particularly related to, but in no way limited to the use of such non-linear transmission lines in interconnect structures for example, on printed circuit boards, back planes, integrated circuits, and surface mount device (SMD) packages.

BACKGROUND TO THE INVENTION

Modern large-scale electronics such as telecommunication or computing systems are usually comprised of many interconnected shelves of processing, access and/or memory modules. The processing, access and memory functions are usually provided by modules that plug into a large printed circuit board (PCB) referred to as a backplane (BP) or midplane (MP) located behind the modules. Due to the huge quantities of data available for processing and storage there is a need for ever-increasing data rates on the modules and BPs. With the advent of synchronous optical networks (SONET), telecommunication and computer systems may be linked together by optical fibres that terminate at these modules. Usually, in order to make use of the data carried by the optical fibre, the module must convert the signals to electrical pulses and demultiplex (demux) them to many slower speed data streams. The highest widely used optical data rate is 10 gigabits per second (OC192). Currently, such a data stream is often demuxed by a factor of 16 or even 64 to get 16 622 megabits per second or 64 155 megabits per second streams. This level of demuxinig contributes greatly to the complexity of the electro-optic and processing/switching modules and the routing density on the PCBs. In addition, the power requirements of the demux and mux units can be significant.

The industry has recognized that it is desirable to allow electrical signals at a data rate exceeding 5 or even 10 gigabits per second to be transmitted over standard copper (or other electrical) interconnect. If this could be made possible, elctro-optic modules would not require a demux function at all since the electrical signal would also be at 10 gigabits per second. Furthermore, the routing and processing hardware would be made simpler since only a fraction of the currently existing I/Os and tracks would be needed.

The principal reason that commercially available 10 gigabits per second electrical interconnect has not previously been achieved is that the standard back plane and other electrical connectors possess too high a level of parasitic inductance, capacitance, resistance and conductance. In addition, the PCBs themselves may introduce prohibitive levels of attenuation due to frequency-dependent track resistance and dielectric substrate conductance. These result in attenuation, harmonic distortion and dispersion (to name a few) to an extent that makes sufficiently error-free transmission of data virtually impossible.

Digital electronic systems face many limitations. For example, at the chip level, huge parallel bus structures are required which cause severe routing congestion and high power consumption is involved, especially in cases where inputs and outputs are muxed. Very large, complex packages are being used increasingly and skew management and jitter (pattern dependent and base-line wander) are further problems. At the printed circuit board level similar limitations are faced. For example, thick multi-layer PCBs are increasingly required for high chip input/output levels and as a result these PCBs tend to be expensive and can be unreliable. Above about 20 MHz matched terminations are required and this increases the power consumption. Skew management and jitter are also problems as at the chip level.

It is accordingly an object of the present invention to provide a voltage biased section of non-linear transmission line, which overcomes or at least mitigates one or more of the problems noted above.

Further benefits and advantages of the invention will become apparent from a consideration of the following detailed description given with reference to the accompanying drawings, which specify and show preferred embodiments of the invention.

SUMMARY OF THE INVENTION

According to an aspect of the present invention there is provided a voltage biased section of non-linear transmission line comprising:

a plurality of transmission line lengths connected together; and a plurality of diodes, one diode connected at each end of each transmission line length; and a voltage applied to the section of non-linear transmission line such that the section of non-linear transmission line is operable over a particular voltage range according to the value of the applied voltage.

This provides the advantage that signal integrity is improved. The section of non-linear transmission line acts to provide pulse edge compression to pulse signals transmitted through it in use and the voltage biasing arranges the section of non-linear transmission line so that it operates on a particular voltage region of the signal.

By improving signal integrity for data transmission rates of about 10 Gbps and above, many advantages are achieved. For example, routing congestion on chips and on printed circuit boards can be reduced and packaging and printed circuit board complexity and cost are also reduced. Importantly, the need for multiplexing between electrical and optical systems is removed as mentioned in the section headed "background of the invention" above.

Another advantage of the present invention is that it enables a decrease in power consumption to be achieved. That is, because signal degradation is reduced it is possible to use a smaller voltage swing for the signal and still obtain reasonable data transmission rates.

Multi-level logic systems involve enabling each bit to be in one of more than two different states. For example, each pulse in a signal may have one of four possible states in a particular multi-level logic system. This enables more information to be transmitted per pulse as compared with a binary system. However, much less noise can be tolerated. The present invention enables multi-level logics to be used to further increase throughput because signal integrity is improved.

Preferably said transmission line lengths and said diodes are provided by a distributed diode. This enables the advantages of distributed diodes as opposed to PCB-based lumped non-linear transmission lines to be achieved.

Preferably a first plurality of said transmission line lengths are connected in series to form a first part and a second plurality of said transmission line lengths are connected in series to form a second part; and wherein said first part is arranged to receive a voltage varying input signal and wherein said second part is at ground potential.

Preferably a resistor is connected in series with said voltage such that the distance between the resistor and the first part is less than the distance between the voltage and the first part. This enables stub effects to be reduced.

The distance between the resistor and the first part is also preferably less than about 1 mm, again in order to reduce stub effects.

According to another aspect of the present invention there is provided a non-linear transmission line comprising a plurality of voltage biased sections of non-linear transmission line connected together in series by way of capacitances. For example, the sections of non-linear transmission line may be given different voltage biases in order that each section performs signal compensation on a different voltage region of signal pulses.

Preferably the non-linear transmission line further comprises a pulse conditioning filter connected in series to one of the sections of non-linear transmission line. This provides additional means of compensating for signal compression and enables the number of NLTL sections to be reduced.

Advantageously the non-linear transmission line further comprises a feedback mechanism arranged to adjust the voltage biasing. This enables the compensation provided by the non-linear transmission line to be adjusted.

The invention also encompasses a printed circuit board comprising a non-linear transmission line as defined above; an integrated circuit comprising a non-linear transmission line as defined above; and an individually machine placeable surface mount device (SMD) package comprising a non-linear transmission line as defined above.

According to another aspect of the invention there is provided a signal processing device comprising two non-linear transmission lines as defined above, one of said non-linear transmission lines being arranged to process the rising edge of signal pulses and the other of said non-linear transmission lines being arranged to process the falling edge of signal pulses. This provides the advantage that both the rising and falling edges of signal pulses are compensated.

According to another aspect of the present invention there is provided a method of processing a signal, comprising a succession of pulses, in order to compensate for signal degradation, said method comprising passing the signal through a voltage biased section of non-linear transmission line such that a particular voltage range of the pulses is subjected to pulse edge compression.

Preferably the method further comprises passing the signal through a plurality of voltage biased sections of non-linear transmission line, each voltage biased section of non-linear transmission line having a different voltage bias, such that a different voltage range of the pulses is subjected to pulse edge compression by each section of non-linear transmission line.

According to another aspect of the present invention there is provided a section of non-linear transmission line comprising a plurality of transmission line lengths connected together; a plurality of diodes, one diode connected at each end of the transmission line length; and an apparatus arranged to apply a voltage to the section of non-linear transmission line, such that in use, when the apparatus applies the voltage, the section of non-linear transmission line is operable over a particular voltage range according to the value of the applied voltage.

The invention is also directed to a method by which the described apparatus operates and including method steps for carrying out every function of the apparatus.

The preferred features may be combined as appropriate, as would be apparent to a skilled person, and may be combined with any of the aspects of the invention.

BRIEF DESCRIPTION OF THE DRAWINGS

In order to show how the invention may be carried into effect, embodiments of the invention are now described below by way of example only and with reference to the accompanying figures in which:

FIG. 4a is a schematic diagram of operation of a standard interconnect.

FIG. 4b is a schematic diagram of operation of an interconnect with active compensation C.

FIG. 11 is a voltage trace showing an input waveform, input to the NLTL section of FIG. 10a.

DETAILED DESCRIPTION OF INVENTION

Embodiments of the present invention are described below by way of example only. These examples represent the best ways of putting the invention into practice that are currently known to the Applicant although they are not the only ways in which this could be achieved.

The term "non-linear transmission line (NLTL)" is used herein to refer to one or more transmission line sections augmented by reverse biased diodes. The transmission line sections and reverse biased diodes may be provided by a distributed diode which as such is a particular embodiment of an NLTL. Embodiments where the diodes are discrete are referred to herein as lumped NLTLs.

Prior art diodes are known which are made up of appropriately doped semiconductor forming a positive-negative (pn)-junction arranged such that current may flow through the junction. These are essentially two-terminal devices with one terminal connected to the positive (p) side and the other to the negative (n) side of the junction. The flow of current orthogonal to this "through" direction is insignificant due to the size of the device and the frequency of the currents involved. The term "distributed diode" is used herein to refer to a diode comprising doped semiconductor forming a pn-junction, which is arranged to provide a two-port device where the width of the pn-junction is the width of the doped semiconductor as described below (A standard non-distributed diode would be more properly described as a one-port device). The distributed diode is preferably arranged for use with a signal which has a particular signal bandwidth and the width of the pn-junction is preferably a significant portion of the wavelengths within this band.

Thus for a distributed diode, the current from p to n is insignificant (or is made so by design) and it is the orthogonally propagating current which is of importance. In other words, the signal appears at one end of the p side and propagates to the other end of the p side in the same way it would propagate down a transmission line—except that for a distributed diode the rising edge of signal pulses will experience compression during propagation along the distributed diode.

Figure 1:
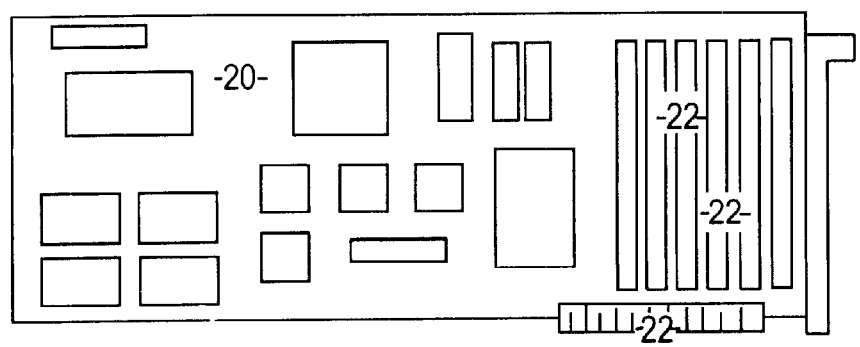
FIG. 1 is a schematic diagram of a printed circuit board in which the signal transmission device according to the invention can be used.

As described above, during transmission of electrical signals over connectors mounted to PCBs and PCB-based transmission lines, signal corruption occurs. This means that error free digital data transmission at rates exceeding 10 gigabits per second have not previously been achieved. FIG. 1 is a schematic view of a printed circuit board 20. The printed circuit boards 20 include an insulating substrate over which are laid thin copper conductors to allow electrical signals to propagate between various components mounted on the printed circuit board 20. The printed circuit board 20 is designed to connect to external components through electrical connectors 22.

Due to skin-effect and dielectric loss whose effects are square-root proportional and directly proportional to frequency respectively, typical copper-based interconnect on the printed circuit board 20 causes significant attenuation and dispersion (time-domain spreading) of the digital pulses at signal frequencies exceeding 1 Gigahertz (GH). This pulse spreading, in turn, can result in inter-symbol interference (ISI) which refers to the phenomenon where portions of pulses overlap one another in the time-domain.

Figure 3:
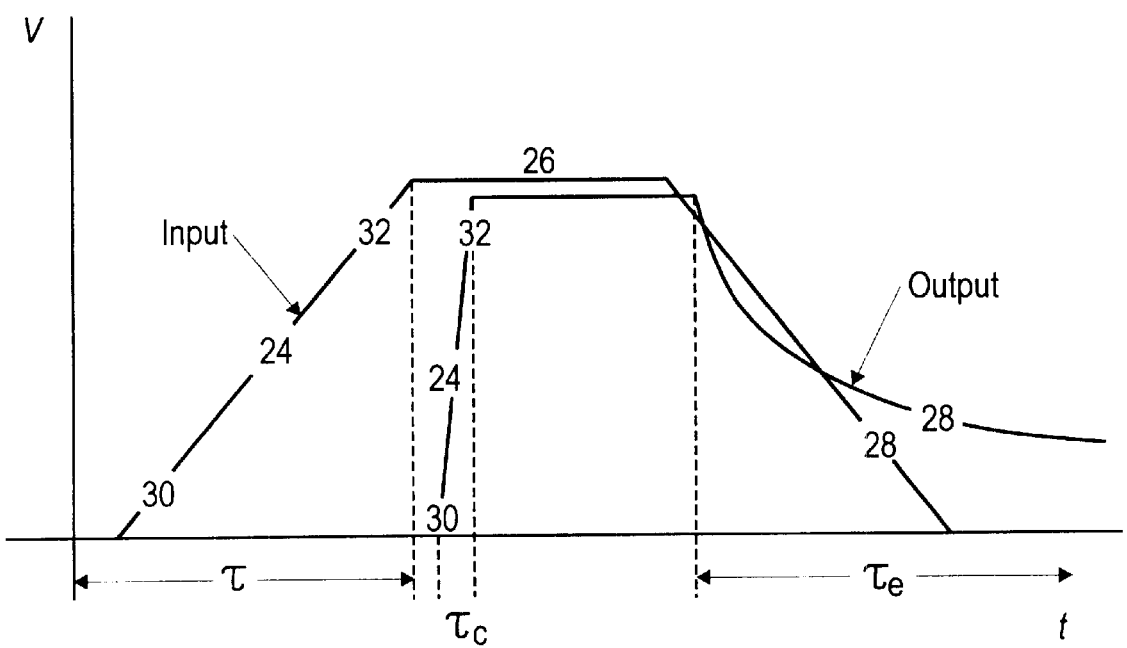
FIG. 3 illustrates the shape of a pulse in the input signal that has long rising and falling edges and the shape of the same pulse when processed in a non-linear transmission line that has the effect of compressing the leading edge and further spreading the trailing edge.

The graph of FIG. 3 labelled "Input" illustrates generally the kind of distortions a pulse in the input signal is subjected to. The pulse has a leading edge 24 a plateau segment 26 and a trailing edge 28. The leading edge has a bottom segment 30 that is further away (in the terms of time) with respect to the top segment 32 of the leading edge 24. This means that the leading edge 24 is spread over a certain time interval T.

The trailing edge 28 of the pulse is subjected to the same type of distortion as described with relation to the leading edge 24.

Ideally, the time interval T should be 0. The larger the distortion the larger the time interval T becomes. Beyond a certain level of distortion, the edges in adjacent pulses of the input signal will start to overlap which renders the data decoding operation impossible or very difficult to perform at best.

Figure 2B:
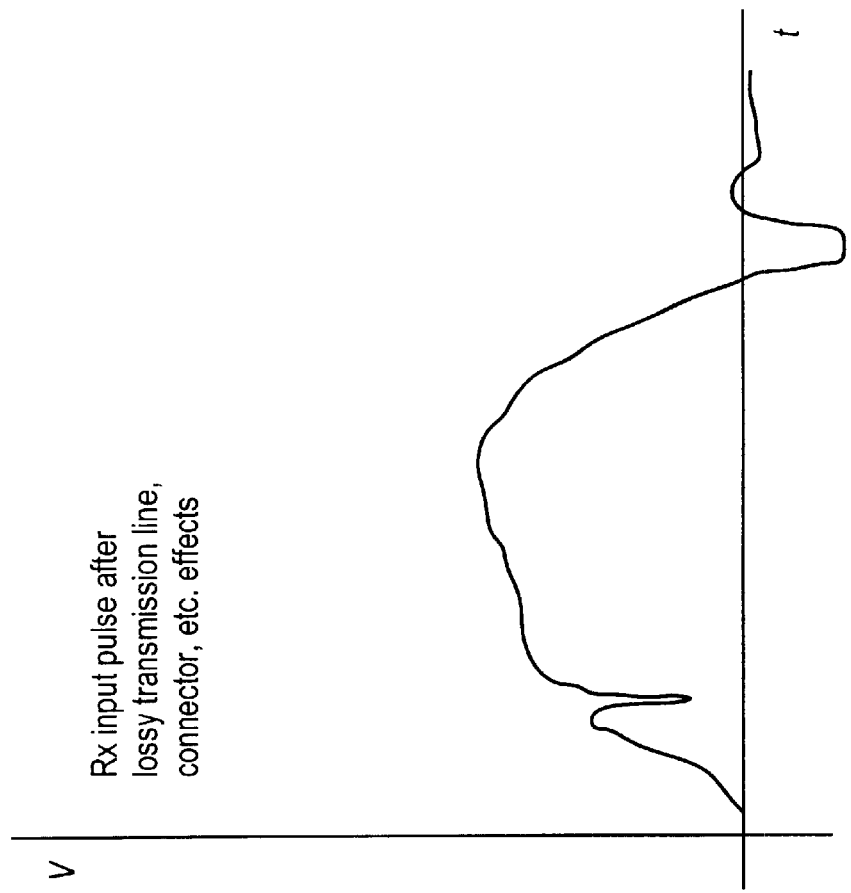
FIG. 2a shows a signal pulse output from a transmitter and FIG. 2b shows the same signal pulse after it has been transmitted along a lossy transmission line.
Figure 2A:
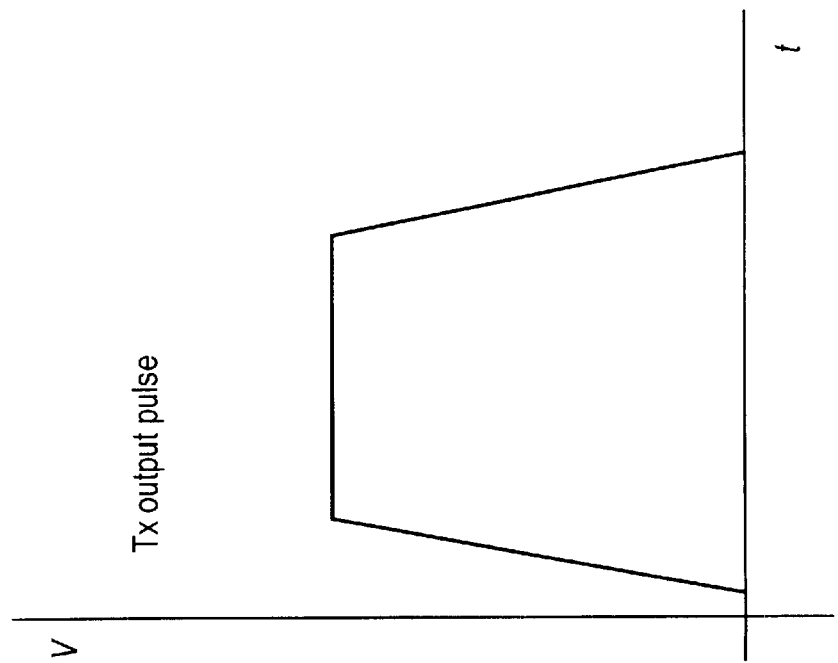

FIGS. 2a and 2b also illustrate the distortion a pulse in the input signal is subjected to. FIG. 2a shows a signal pulse recently output from a transmitter and FIG. 2b shows that same signal pulse once it has reached a receiver at the end of a lossy transmission line. The x axis represents time and the y axis voltage.

The present invention compensates for the degradation and so allows for reliable high data rate transmission over electrical interconnects. This is illustrated in FIGS. 4a and 4b. FIG. 4a shows a transmitter 41 and a receiver 42 and a signal transmitted between these two entities along a transmission line. The signal is subject to corruption or degradation as it passes along the transmission line as indicated by the transfer function I=H(s). The present invention provides compensation C, (which may be active compensation) as indicated in FIG. 4b. This compensation may be applied in advance, that is the signal from the transmitter is enhanced in such a manner that as a result of the degradation it reaches the receiver in the required form. Alternatively, the compensation is applied to the signal after degradation of that signal has occurred. Many other variations on these two manners of applying the compensation are possible. For example, compensation may be applied at a plurality of stages as the signal passes along the transmission line.

Figure 5:
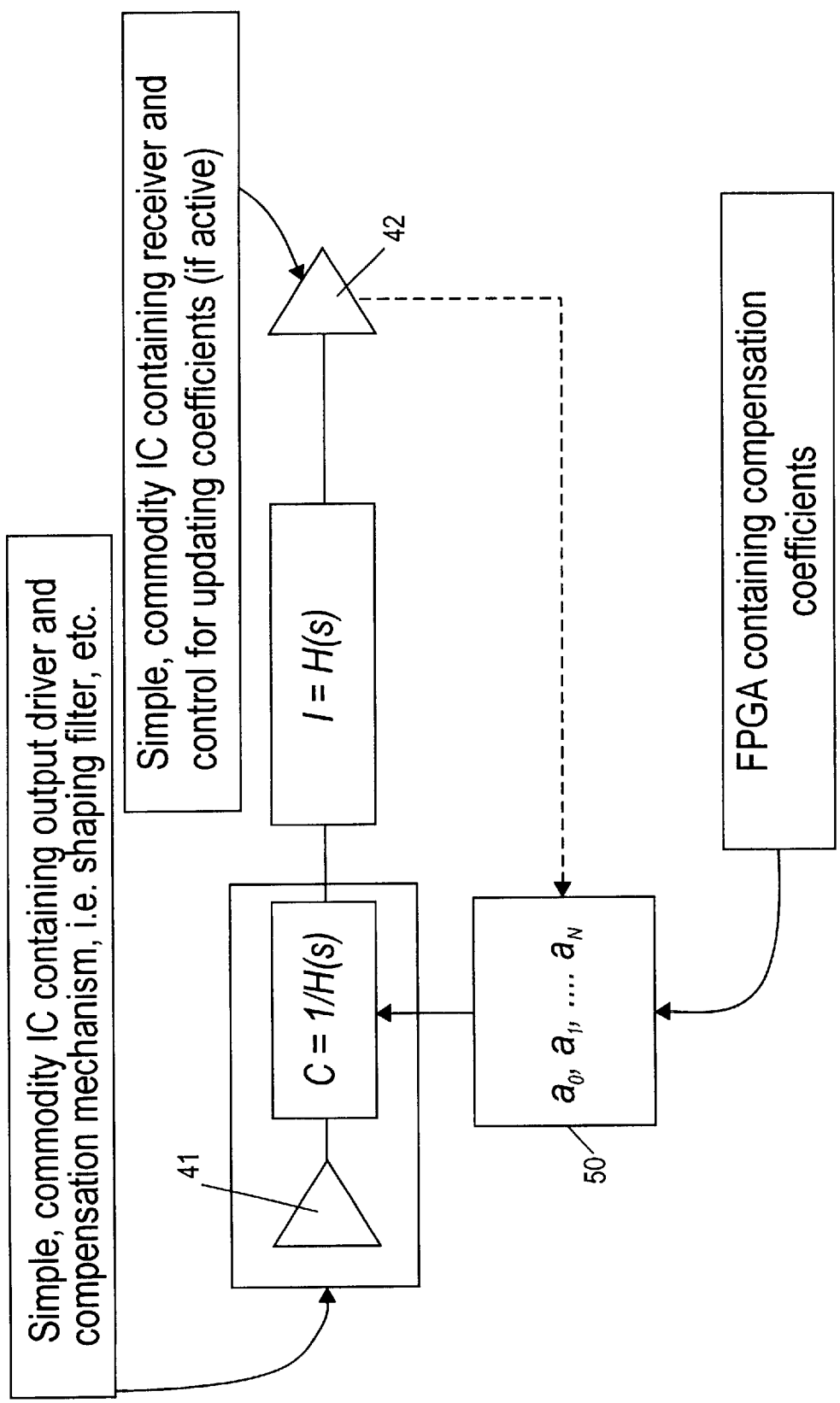
FIG. 5 is a schematic diagram of operation of the interconnect of FIG. 4b with a feedback system.

In a preferred embodiment, a feedback mechanism is used, as illustrated in FIG. 5. A transmitter 41 and receiver 42 at either end of a lossy transmission line are shown as in FIGS. 4a and 4b and compensation C is used to counteract the effect of signal degradation. With changes in temperature, movement of the apparatus and other factors, the amount of compensation C required to optimally counteract signal degradation changes. In order to take this into account, a feedback mechanism is used to adjust C according to changes in the performance of the transmission line. In a particular example, C is adjusted by altering a plurality of coefficients 50. This is described in more detail below.

The compensation C may be provided in several different ways. In a first embodiment, one or more DC biased sections of non-linear transmission line (NLTL) are used, and in a second embodiment a distributed diode is used. Our earlier, co-pending U.S. patent application Ser. No. 09/471,322 describes another possibility, in which C is provided by a section of NLTL.

DC Biased Sections of NLTL

Figure 6:
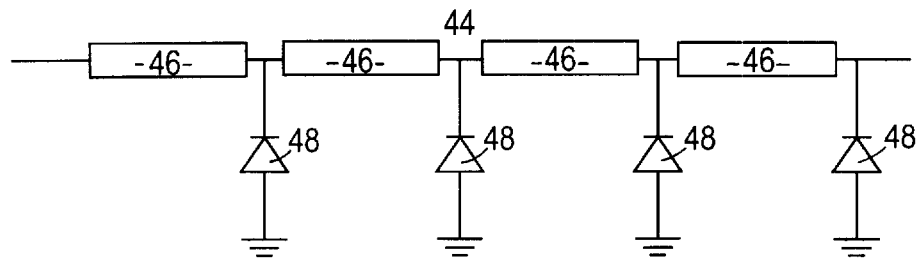
FIG. 6 is a circuit diagram of a non-linear transmission line.

We have developed DC biased sections of NLTL as an extension of our earlier work that is described in the co-pending US patent application mentioned above. FIG. 6 shows an example of an NLTL section. This comprises one or more (usually dozens) of ordinary transmission line sections 46 augmented by reverse biased diodes 48.

The propagation delay $t_{pd}$ of an ordinary transmission line is given by $$t_{pd} = \sqrt{LC} \qquad (1)$$

where L and C are the per unit inductance and capacitance of the transmission line. However, the equation must be modified in the case where diodes are present. In this case the propagation $t_D$ delay is given by $$t_D = \sqrt{L(C+C_D)} \qquad (2)$$

where $C_D$ is the reverse-biased diode capacitance. The diode capacitance is, in turn, a function of the voltage across the diode and can be expressed by $$C_D = \frac{C_{J0}}{\left(1 - \frac{V_D}{\phi}\right)^\gamma} \quad (3)$$

where $C_{J0}$ is the zero-bias voltage capacitance of the pn-junction, $V_D$ is the diode voltage (will be negative due to reverse biasing), $\phi$ is a process constant which is usually in the range of 0.5 to 1.0, and $\gamma$ is the doping profile of the pn-junction. Usually, $\gamma$ is equal to about 0.5 but for hyper-abrupt junction (varactor) diodes, $\gamma$ may be as high as 2. In this case, pulse edge compression has been observed for $0.5 < \gamma < 1.2$.

An NLTL such as the one illustrated in FIG. 6 can be used to compress the leading edge of a signal pulse as described in our earlier co-pending patent application mentioned above, and as now described for completeness.

From (3) it is clear that $C_D$ is a function of voltage $V_D$ across the diode. From (2) it is also apparent that through (3) the propagation delay is also dependent on $V_D$. This means that as the pulse ramps up during $T_c$, the bottom segment 30 of the leading edge 24 propagates more slowly than the top segment 32 allowing the top to "catch up" which causes the output waveform to appear as it does on the leading edge of the "Output" waveform. In other words, the leading edge 24 is compressed by virtue of a reduction of the time interval T. When the waveform begins to return to zero, the capacitance now begins to increase resulting in the long fall-time. Again, the top segment of the trailing edge propagates faster than the bottom segment that causes the time interval over which the trailing edge is spread to increase to $T_e$.

Figure 7A:
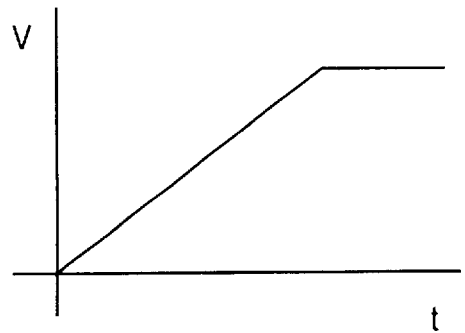
FIG. 7a shows the leading edge of a linearly increasing ramp signal pulse and FIG. 7b shows the same leading edge of the signal pulse after operation of a non-linear transmission line.
Figure 7B:
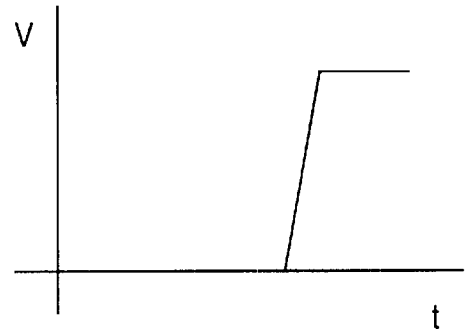
Figure 8A:
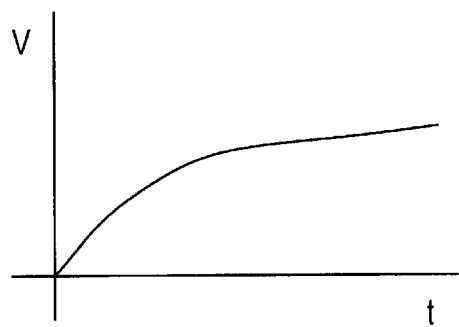
FIG. 8a shows the leading edge of a signal pulse that has passed through lossy interconnect media and FIG. 8b shows the same leading edge of the signal pulse after operation of a non-linear transmission line with a 0V DC-bias.
Figure 8B:
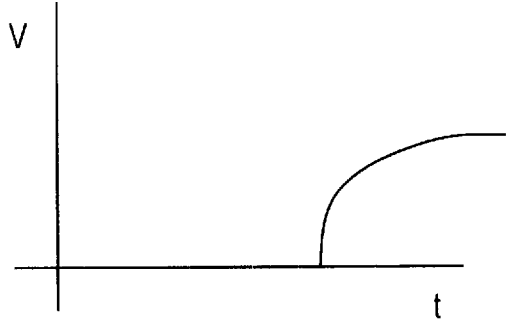

The effect of the NLTL of FIG. 6 on the leading edge of the pulse in FIG. 3 is shown again in FIG. 7 for reasons of clarity. FIG. 7a shows a linearly increasing ramp and FIG. 7b shows the result of compressing that linearly increasing ramp using an NLTL such as the NLTL of FIG. 6. This shows that the NLTL produces the required results when the input is a linearly increasing ramp. However, the linearly increasing ramp of FIG. 7a is not found in practice for signal pulses that have traversed lossy interconnect media. In that case, the form of the pulse is as shown in FIG. 8a. FIG. 8b shows the result of using an NLTL on the signal of FIG. 8a. Because the compression effect of the NLTL is greatest at low voltages it can be seen that the higher voltage area of the pulse is still far from ideal because little compression has occurred here.

Figure 9:
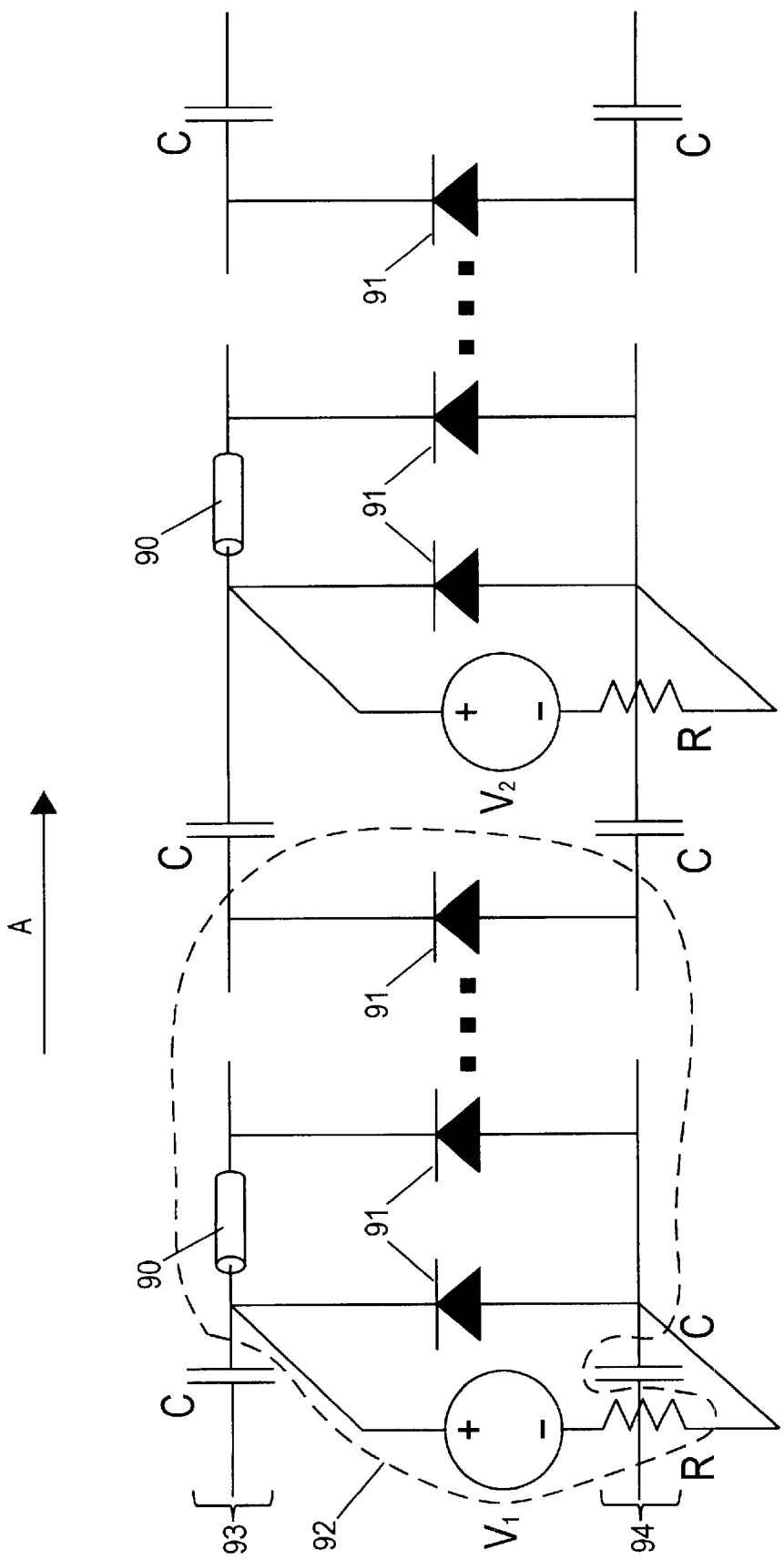
FIG. 9 shows two DC biased sections of non-linear transmission line.

In order to address this problem, two or more different sections of NLTL are used, each to perform compensation on a different voltage range of the signal. This is illustrated in FIG. 9. As for the NLTL of FIG. 6 sections of linear transmission line 90 are augmented by reverse bias diodes 91. In addition, capacitors C are used and the NLTL is considered as comprising two or more sections, to each of which a DC bias voltage $(V_1, V_2, \ldots)$ is applied. Once such section of the NLTL is indicated by the dotted region 92 in FIG. 9.

Each section 92 of the NLTL of FIG. 9 comprises a plurality of linear transmission line sections 90 connected in series with a reverse bias diode 91 connected in front and behind each linear transmission line section 90. Each section may comprise about 60 or more reverse bias diodes and sections of linear transmission line or any other suitable number of those elements. It has been found that the benefit gained by use of the diodes is relatively small until a particular number of diodes (e.g. around 60) are used. At that point a significant benefit is produced. If too many diodes 91 are used signal losses as a result of the diodes themselves increase. However, the preferred number of diodes to use is highly variable depending on the situation in which the NLTL is to be used.

Preferably, the sections of linear transmission line 90 are each of the order of a fraction of a millimeter in length (that is, less than one millimeter in length). This is required in order to obtain the required edge compression. Basically, the longer the space between diodes, the less effective the NLTL will be in causing compression. In the case of the distributed diode there is no preferred length. However, in the distributed diode case there are practical considerations which limit how small the length can be. For example, in some applications excitation of a specific frequency is important. In such cases, the desired length is related to the wavelength of the frequency.

The upper part 93 of the NLTL of FIG. 9 is at waveform potential when a signal is applied across the upper part 93 and the lower part 94 of the NLTL. The lower part 94 of the NLTL is at ground potential.

The DC biased sections 92 of the NLTL of FIG. 9 are coupled together in series by way of capacitances C as shown in FIG. 9. The purpose of the capacitances C is to only allow time varying waveforms to pass through the NLTL sections. The capacitances C are fairly large, i.e. greater than about 1 nF so that at the signal frequencies in question, i.e. about 1 GHz, there is no effect on the signal quality. Roughly speaking, C needs to be at least $15/(2\pi f_d)$ where $f_d$ is the fundamental data (clock) frequency. Smaller Cs can also be used but are proportionately less effective.

A particular DC bias voltage is applied to each section of NLTL 92 as indicated by symbols $V_1$, $V_2$ in FIG. 9. These voltages are used to enable each-section of NLTL 92 to only affect a particular voltage range of a signal. For example, consider a signal that is transmitted from left to right, in the direction of arrow A in FIG. 9. By selecting the appropriate bias voltage $V_n$, the compression effect of the section of NLTL is delayed until a desired voltage is reached. For example, let V1=−3V and V2=0V. In that case, a pulse travelling from the left does not experience any pulse edge compression from the first NLTL section until the waveform (signal) voltage exceeds 3V. Any part of the signal pulse edge that exceeds 3V experiences maximum compression from the first NLTL section whilst other parts of the pulse edge are not affected. Once the pulse proceeds into the second NLTL section, in which the bias voltage is set at 0V, the remainder of the pulse edge is maximally compressed.

As shown in FIG. 9, a resistor R is connected next to each of the bias voltages, $V_1$, $V_2$ etc. These resistors are on the order of 1 MegΩ. There are two reasons for this. First, the forward bias capacitance of the diodes is proportional to the current through the diodes which is to be kept small (forward biasing occurs when the bias voltages $V_1$, $V_2$, etc. are negative). Secondly, the resistors R are kept much larger than the characteristic impedance of the transmission lines to which these sections connect. This prevents the sections from loading the transmission lines and adversely affecting the signal quality.

Figure 10B:
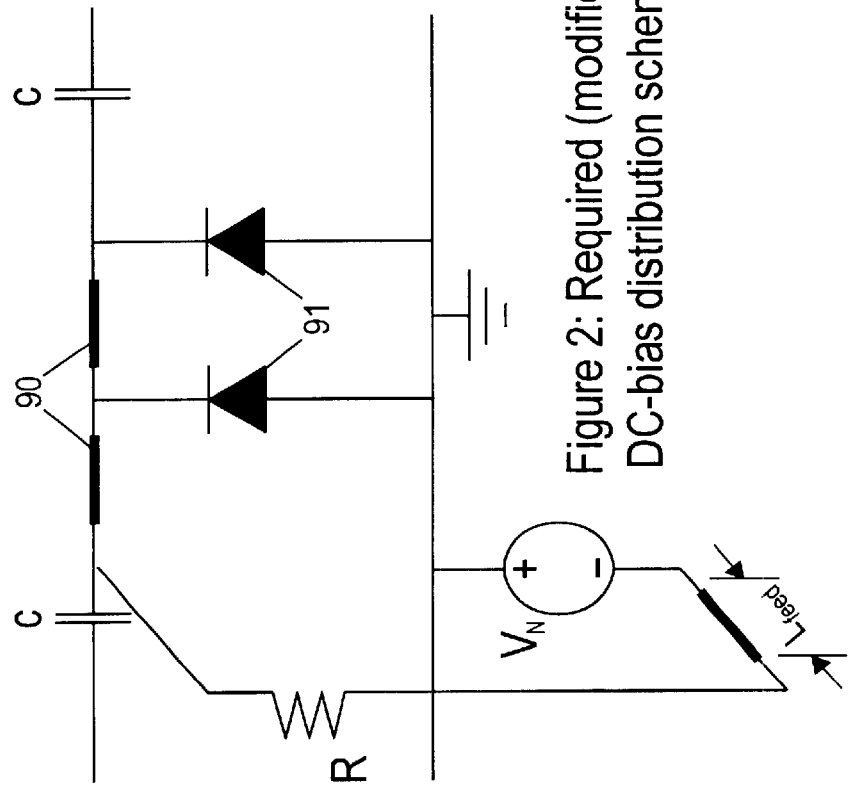
FIG. 10b shows another embodiment of a DC biased section of non-linear transmission line (NLTL)(which does not cause stub-line effects).
Figure 10A:
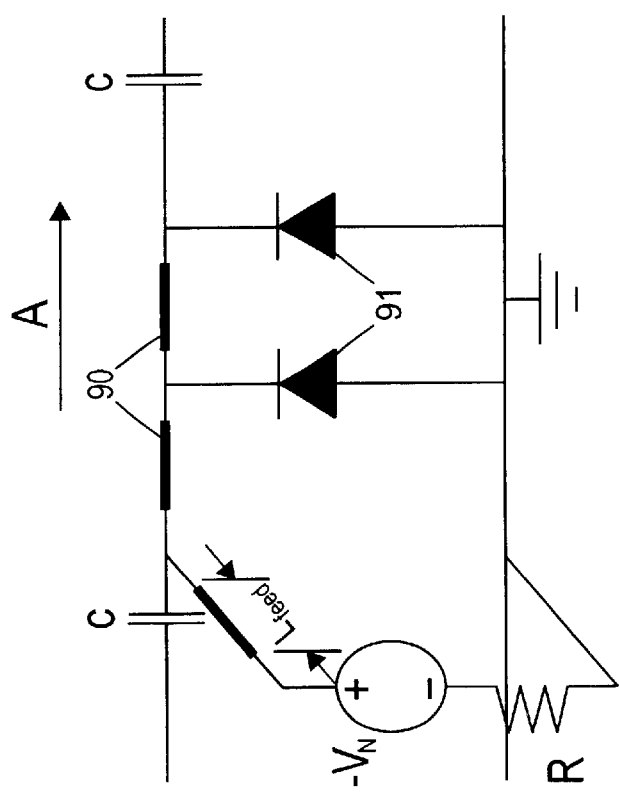
FIG. 10a shows a DC biased section of non-linear transmission line and indicates the distance Lt, (which causes stub-line effects).

The structure illustrated in FIG. 9 is preferred in the situation that the length of the connection between a bias voltage V1 and the transmission line to which it is connected is small. This distance is labelled $L_{feed}$ in FIGS. 10a and 10b. For example, it has been found that for the NLTL section of FIG. 10a, in the case that $L_{feed}$ is 5 mm or greater, a so called "stub" effect occurs which impairs the signal quality. FIGS. 10a and 10b use the same reference numerals as are used in FIG. 9 for corresponding parts.

Figure 11:
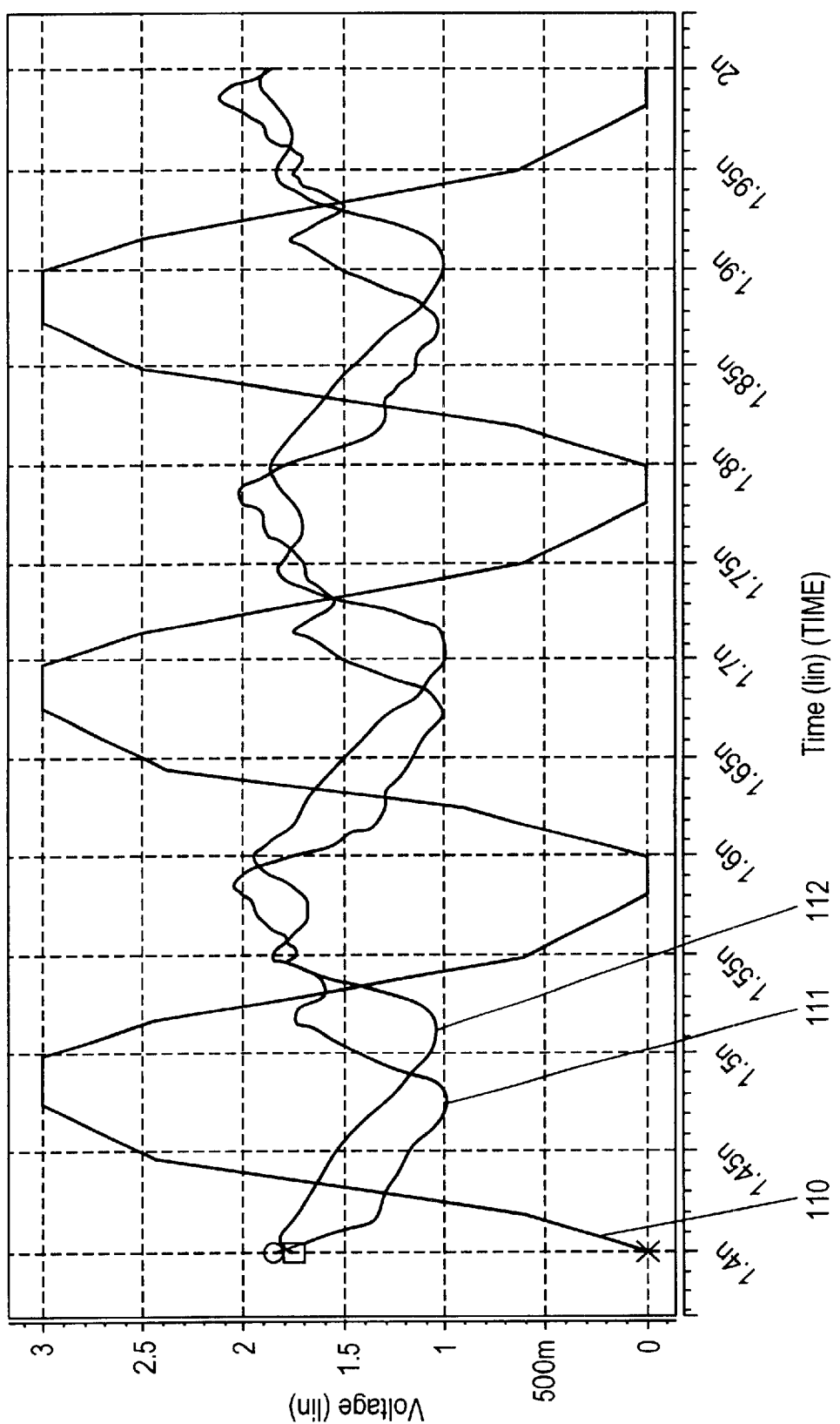

FIG. 11 is a voltage trace showing an input waveform 110, input to the NLTL section of FIG. 10a. The NLTL section of FIG. 10a has a 1 cm lossy transmission line before the NLTL section and a 5 mm DC bias feed stub (i.e. $L_{feed}$=5 mm). Once the input waveform has passed through the 1 cm lossy transmission line it is degraded and appears as shown by line 112 in FIG. 11.

After transmission through the NLTL section and thus after the effects of the 5 mm DC bias feed stub, the waveform of line 111 appears as waveform 112 in FIG. 11. As can be seen from FIG. 11, the signal quality is impaired.

In order to alleviate the effects of the DC bias feed stub, the arrangement of FIG. 10b is used. In this case, the resistor R and the voltage $V_N$ are still connected in series but the position of the resistor and voltage $V_N$ are reversed so that the resistor is closer to the transmission line section. Also, the resistor R is no more than about 1 mm from its connection to the transmission line in order to prevent stub effects. The resistor R is on the order of 1 MegΩ and its tolerance may be as large as 50%. As explained above, this prevents the DC biasing network from loading the transmission line and limits the forward bias capacitance of the diodes.

Figure 12:
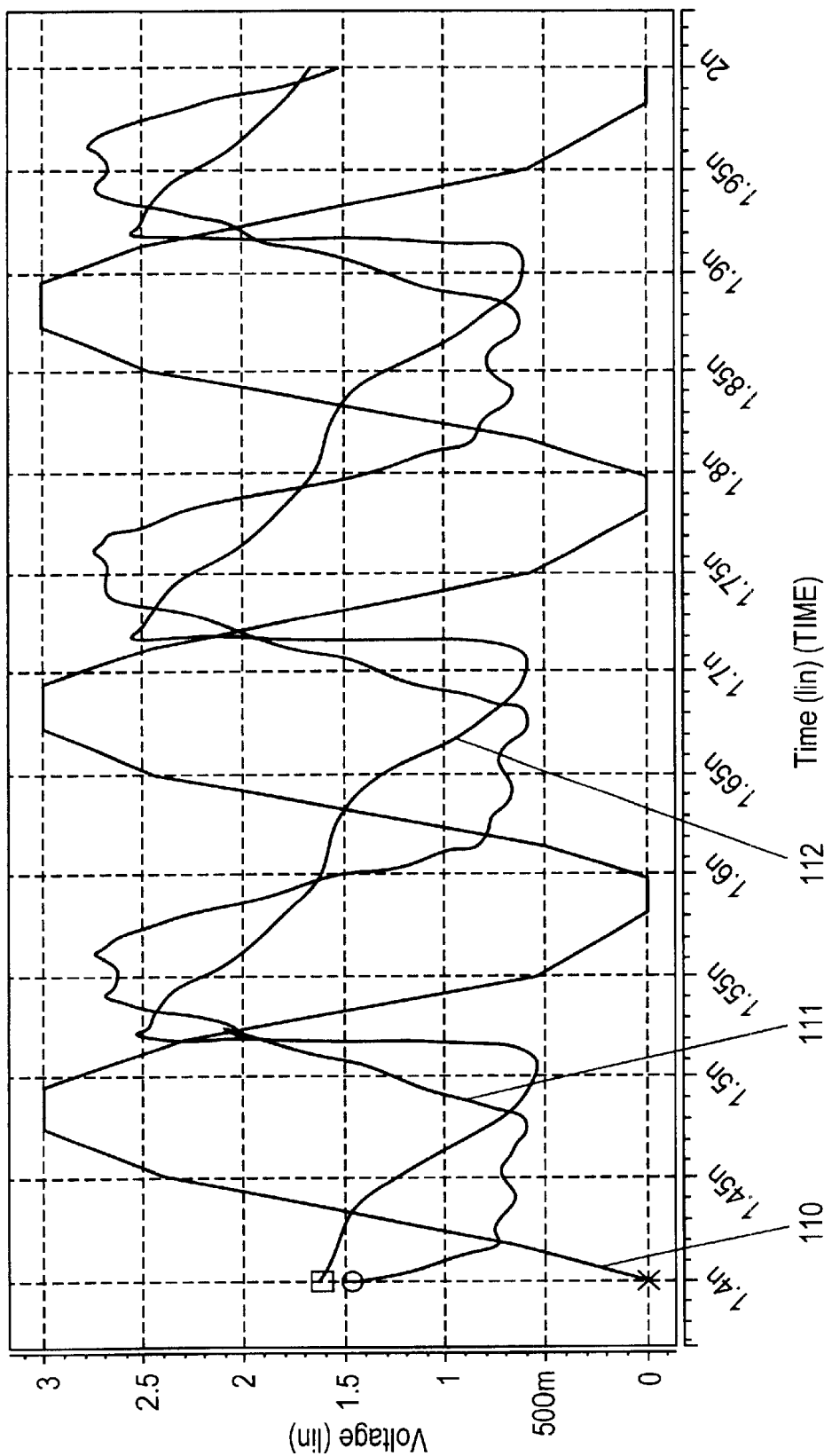
FIG. 12 is another voltage trace showing an input waveform, input to the NLTL section of FIG. 10b.

The structure of FIG. 10b enables the value of $L_{feed}$ to be increased without significantly affecting signal quality even at 10 Gbps. This is because the propagating signal encounters the large resistance R immediately eliminating any stub effects from the signal's point of view. The DC bias voltage may be much further away because by definition there are no transmission line effects for DC signals. For example, FIG. 12 shows simulation results for the situation where $L_{feed}$ in the structure of FIG. 10b is 7 cm. The input waveform 110 in FIG. 12 is the same as that for FIG. 11. After transmission through a 1 cm lossy transmission line the waveform is degraded and appears as shown by line 111 in FIG. 12. The waveform of line 111 is then input to the NLTL section of FIG. 10b and the resulting output is shown by line 112 of FIG. 12. As can be seen from FIG. 12 the signal quality is significantly improved compared with the signal quality shown in FIG. 11, line 112.

Distributed Diode

As described above NLTLs, including DC biased sections of NLTLs, can be used to compensate for signal degradation in transmission lines such as those used on printed circuit boards and with back plane connectors. Whilst the structures described above for the NLTLs and DC biased sections of NLTLs perform the required function of compensating for signal degradation, the functionality of the NLTLs and DC biased sections can also be achieved using a distributed diode as now described. That is, one embodiment of an NLTL is a distributed diode as mentioned above.

Figure 13:
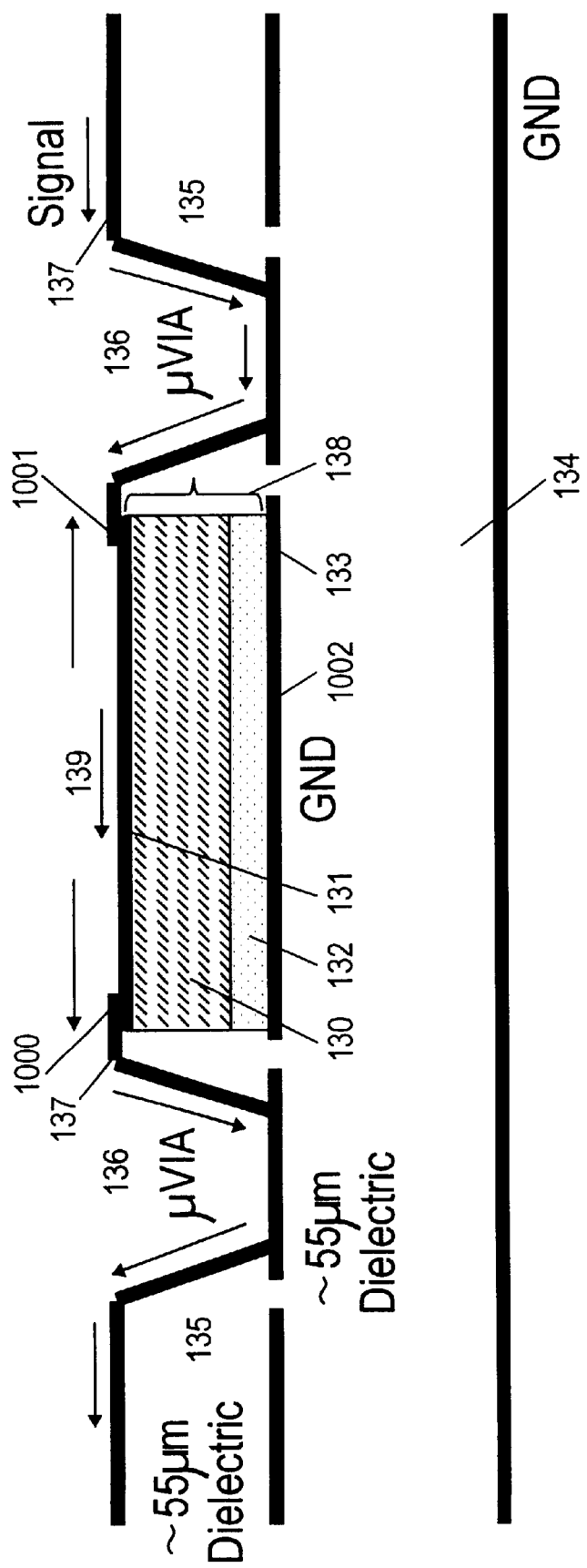
FIG. 13 is a schematic diagram of a distributed Schottky diode on a printed circuit board.

FIG. 13 is a schematic diagram of a distributed diode 138, which in this case is a Schottky diode although any suitable type of distributed diode may be formed. The distributed diode 138 itself is formed from a layer of doped semi-conducting material 130 which has a relatively thinner layer of conducting material 131 over its surface. Preferably, the conducting material is platinum although any suitable metal or other conducting material may be used as is known in the art. The doped semi-conducting material 130 is N-doped for positive signals and P-doped for negative signals. For example the semi-conducting material may be silicon, gallium arsenide (GaAs), silicon germanium (SiGe), Indium phosphide (InP) or any other suitable semi-conducting material. A pn-junction is thus formed as is known in the art and the width of the pn-junction is thus the length of the diode itself, i.e. length 13a in FIG. 13.

These two layers of N-doped silicon 130 and platinum 131 form a distributed diode which acts as an infinite number of infinitely small diodes. The diode effectively has two-ports (four terminals) (1000, 1001 and 1002). When a signal waveform approaches the distributed diode (either from the left or right in FIG. 13) the waveform begins to propagate over what appears to be a microstrip or stripline which acts as an infinite number of infinitely small diodes. The distributed diode is 10 mm long in a preferred example for 10 Gbps applications such that the signal travels along about 10 mm of diode in the direction indicated by the arrows in FIG. 13. However, other sizes of distributed diode may be used. For example at 40 Gbps the distributed diode may be 2.5 mm long. Because the distributed diode itself acts as an infinite number of infinitely small diodes it performs the function of an NLTL but with the advantage that the distributed diode structure is significantly smaller than an equivalent NLTL such as that shown in FIG. 6. Also, the performance of the PCB-based distributed diode is significantly better than that of a PCB-based lumped NLTL simply because it is not possible to create an NLTL with an infinite number of diodes and because the transmission line sections between the diodes in an NLTL (sections 46 in FIG. 6) are lossy and have a minimum size that is significant.

Below the N-doped silicon a layer of insulating material 132 such as silicon dioxide is provided. The distributed diode 138 may be embedded in a circuit board. For example, in FIG. 13 the diode itself, comprising the platinum 131, N-doped silicon 130 and silicon dioxide 132 layers is supported on a ground potential layer 133 over a first dielectric support 134 that is about 55 micro meters thick. Other structures are also supported on the first dielectric support 134. These include further areas of dielectric material 135 in which micro vias 136 are provided with the surface of these further areas of dielectric material 135 and the micro vias 136 being covered with conducting material 137 which contacts the diode. Thus a signal is able to travel along this conducting material, through a micro via, through the diode and through another micro via as indicated by the arrows in FIG. 13 (or in the opposite direction).

Because the N-doped silicon is lossy it causes unwanted signal attenuation. In order to counter this the layer of silicon dioxide 132 is provided to ensure that the real current to ground is very small. Preferably the silicon dioxide layer 132 is only a few micro meters thick such that its capacitance is large and therefore invisible compared with the much smaller reverse biased diode capacitance.

Several distributed diode structures such as that illustrated in FIG. 13 may be connected in series and voltage biased in a similar manner to the sections of NLTL shown in FIG. 9. This enables the advantages of the structure of FIG. 9 to be achieved using distributed diodes in place of lumped NLTL sections.

Figure 15:
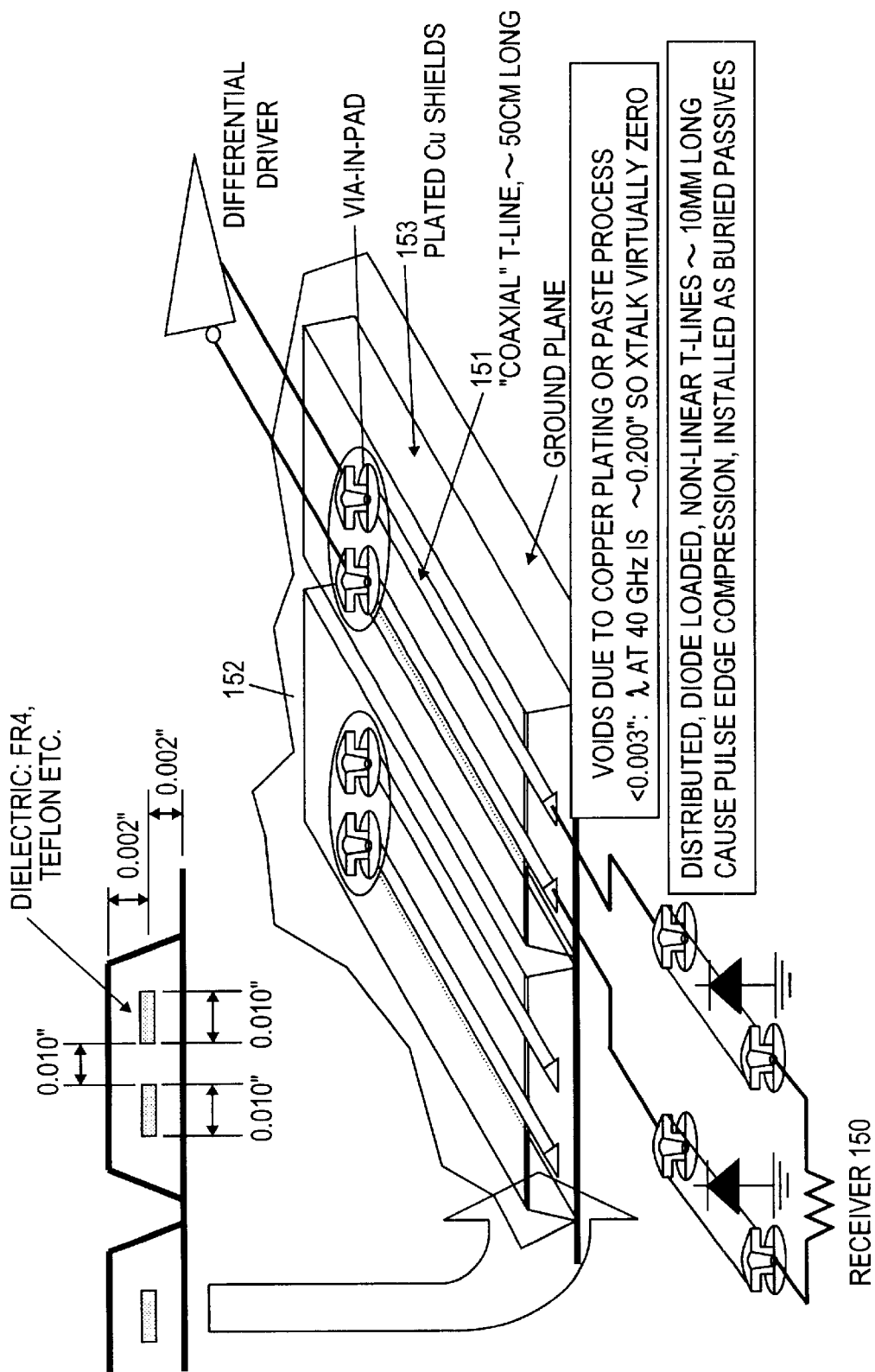
FIG. 15 shows two pairs of coaxial transmission lines that are supported in micro vias in a printed circuit board and indicates how NLTLs or distributed diodes can be used to increase the length of the transmission lines.

An example of how the distributed diode of FIG. 13 can be used to provide improved transmission lines is illustrated in FIG. 15. FIG. 15 shows two pairs of coaxial transmission lines 151 that are supported in micro vias in a printed circuit board 152 between plated copper shields 153. Signals are passed along the transmission lines to a receiver 150. One problem with existing arrangements which use such transmission lines is that the transmission lines need to be narrow in order to reduce cross talk between them, but at the same time signal degradation due to narrow transmission lines and use of high frequency signals needs to be avoided. Thus, such transmission lines have only been possible for short distances of a few centimeters when track that is less than about 0.01016 cm (4 thousands of an inch) wide is used for example. However, by using NLTL sections or distributed diodes it may be possible to increase the length of the transmission lines to about 50 cm or longer. For example, one or more distributed diodes similar to that illustrated in FIG. 13 may be connected in front of each of the transmission lines in FIG. 15. These distributed diodes may be installed as buried passives in the printed circuit board. This enables the signal to be enhanced prior to transmission such that when the signal reaches the receiver, signal degradation that occurred along the transmission line has not made the signal un-usable. Further NLTL sections, for example, distributed diodes may then be used to enhance the signal at the receiver.

Pulse Conditioning Filter

Figure 14B:
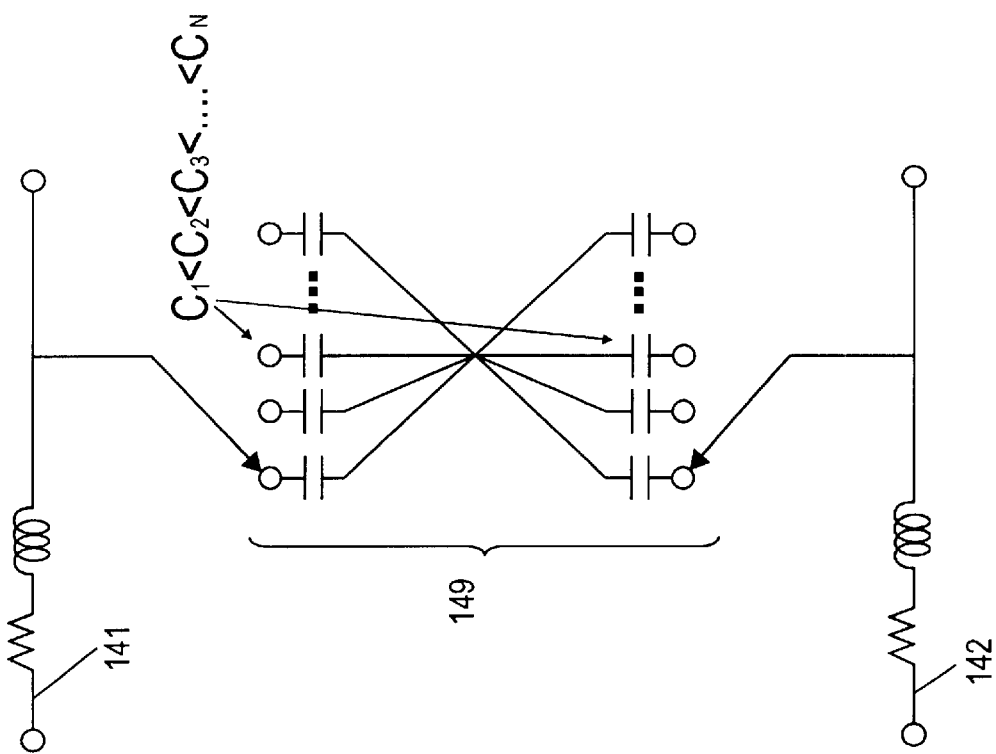
FIG. 14b is a circuit diagram of another embodiment of a pulse conditioning filter.
Figure 14A:
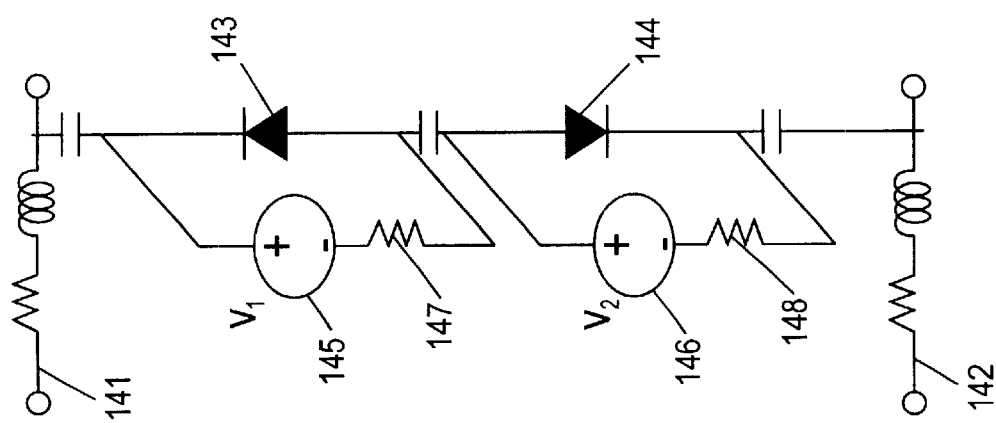
FIG. 14a is a circuit diagram of a pulse conditioning filter.

FIGS. 14a and 14b show two different forms of pulse conditioning filter. We are able to achieved advantages by using these as additional means of providing compensation for signal degradation in conjunction with NLTLs such as lumped NLTLs or distributed diodes. By doing this the number of NLTL sections or the size of the distributed diode required is reduced. The pulse conditioning filters act by accentuating certain harmonics in the signal and are advantageous because they are readily controllable and relatively simple to manufacture. The pulse conditioning filters of FIG. 14a and FIG. 14b are particular examples; other suitable pulse conditioning filters can be used. The examples shown in FIGS. 14a and 14b are both arranged for use in the situation in which the signal is divided into two parts, each channelled along a separate line such that the rising edge of the signal pulses and the falling edge of the signal pulses can be passed through separate compensation mechanisms on the separate lines. Thus in both FIG. 14a and FIG. 14b two separate signal lines 141, 142 are shown one for the part of the signal that has been compensated using a rising edge compensation mechanism and one for the part of the signal that has been compensated using a falling edge compensation mechanism.

The pulse conditioning filter of FIG. 14a comprises two diodes 143, 144 connected in series between the two signal lines 141, 142. These diodes are each biased by a DC voltage 145, 146, $V_1$, $V_2$ connected in series with a resistor 147, 148 such that each diode 143, 144 acts in a similar manner to those of the NLTL DC biased sections described above with reference to FIG. 9. Thus the upper DC biased diode 143 acts to enhance the rising edge of signal pulses and the lower DC biased diode 144 acts to enhance the falling edge of signal pulses.

FIG. 14b shows a second form of pulse conditioning filter with a variable capacitance mechanism 149 connected between the two signal lines 141, 142. This acts as a multi-position switch for each of the signal lines, with each switch position corresponding to a different capacitance level, $C_1$, $C_2$, $C_3$ . . . $C_N$ as indicated in FIG. 14b. The switch-positions are controlled automatically by an electrically actuated micro-electro-mechanical system (MEMS) device for example and may be different for each signal line 141, 142. The pulse conditioning filter of 14b is able to select the preferred wave-shape through appropriate capacitance selection. Hence depending on the desired wave-shape, the appropriate capacitance is selected.

As mentioned above pulse conditioning filters are preferably used in conjunction with NLTLs such as lumped NLTLs or distributed diodes. This is because, if a signal is severely degraded operation of a pulse conditioning filter on that degraded signal is not very successful. However, by first using NLTLs to enhance the signal, a pulse conditioning filter is then effective. This is illustrated in FIG. 16.

Figure 16:
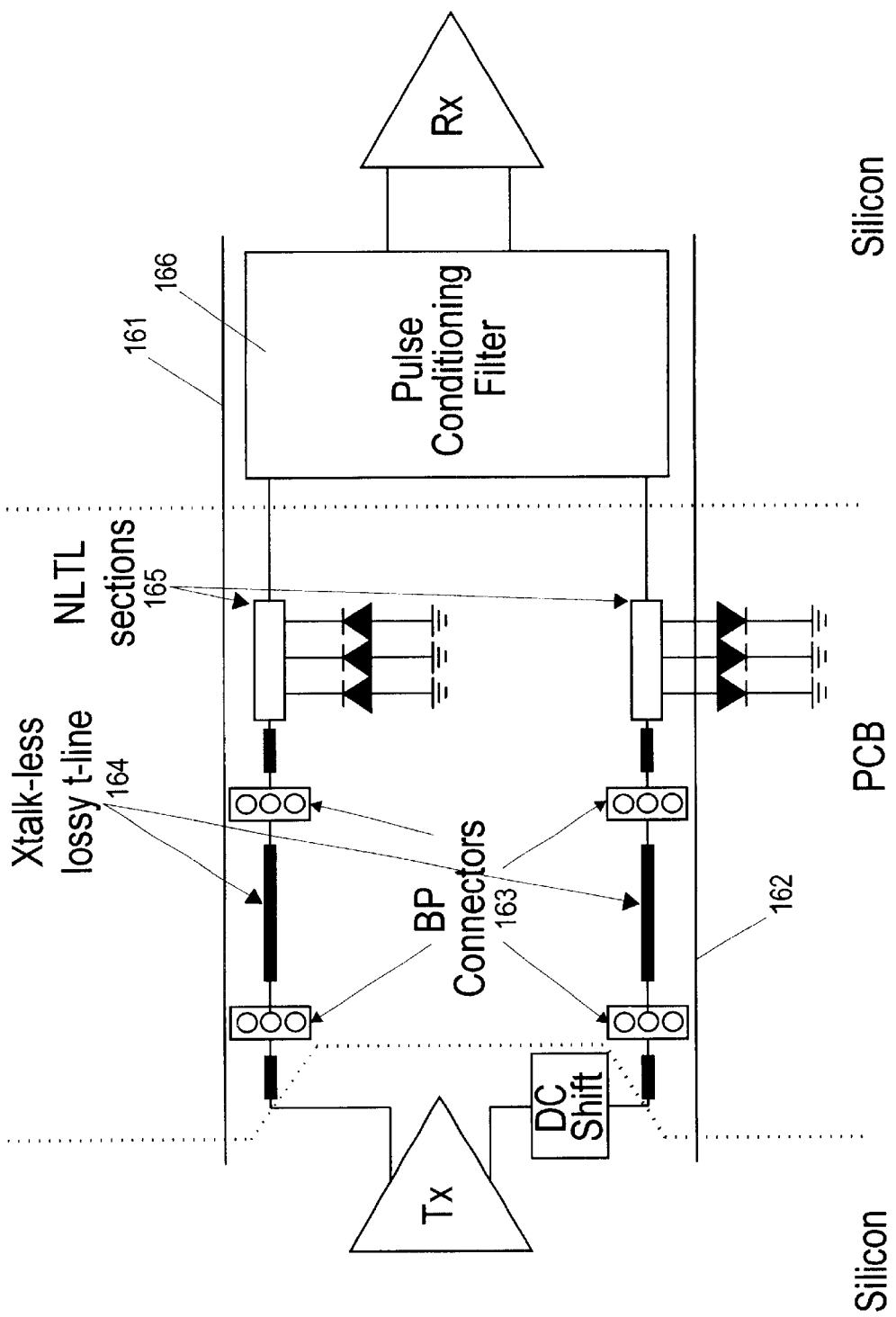
FIG. 16 is a circuit diagram of a signal transmission device incorporating a pulse conditioning filter.

FIG. 16 shows a device Tx which outputs the same signal along two transmission lines 161, 162 to a receiver Rx. The first of these transmission lines 161 comprises a back plane connector 163 connected to a lossy transmission line section 164 on a back plane which eventually connects to another back plane connector 163. This back plane connector 163 is then connected to one or more lumped NLTL sections 165 (or distributed diodes) which are in turn connected to a pulse conditioning filter 166. The NLTL sections 165 or distributed diodes and the pulse conditioning filter of the first transmission line are arranged to provide compensation for signal degradation to the rising edge of signal pulses. The second transmission line 162 comprises similar components as the first transmission line 161 and is arranged to provide compensation for signal degradation to the falling edge of signal pulses. The pulse conditioning filter 166 shown in FIG. 16 may be any suitable pulse conditioning filter such as that shown in FIG. 14a or FIG. 14b.

It is not necessarily essential to use two signal transmission lines 161, 162 as shown in FIG. 16. Another possibility is to use a plurality of voltage biased NLTL sections as described with reference to FIG. 9, in which a first group of the NLTL sections act on the rising edge of signal pulses and a second group of the NLTL sections act on the falling edge of signal pulses. This is also possible using a plurality of voltage biased distributed- diodes connected in series or indeed a combination of voltage biased lumped NLTL sections or distributed diodes. This provides the advantage that only one transmission line is required instead, of two which reduces costs, space requirements and manufacturing complexity.

In the situation that only a single transmission line is used, care needs to be taken that NLTL sections or distributed diodes that are arranged to act only on a particular edge of the signal pulses, do not detriment the opposite transition edges of those signal pulses. For example, FIG. 3 shows the form of an input pulse that is input to an NLTL (or distributed diode as in FIG. 13) together with the resulting output from that NLTL or distributed diode (see output label in FIG. 3). The NLTL acts to compress the rising edge of the pulse but the falling edge of the input pulse (part 28 of the line labelled input in FIG. 3) is expanded as a result of the NLTL's action. In order to alleviate expansion of the falling edge of the input pulse (or degradation of the rising edge of a pulse in the case that the lumped NLTL or distributed diode is arranged to act only on the falling edge of the pulse) distributed diodes that have a graduated intrinsic diode capacitance are used as described below.

The capacitance of a distributed diode $C_D$, such as that illustrated in FIG. 13 is given by equation (3) above in the section headed "DC biased sections of NLTL". From that equation it can be seen that $C_D$ is a function of the voltage across the diode $V_D$ as well as of $C_{JO}$, the zero-bias voltage capacitance of the pn-junction which can also be termed the intrinsic diode capacitance.

Figure 17:
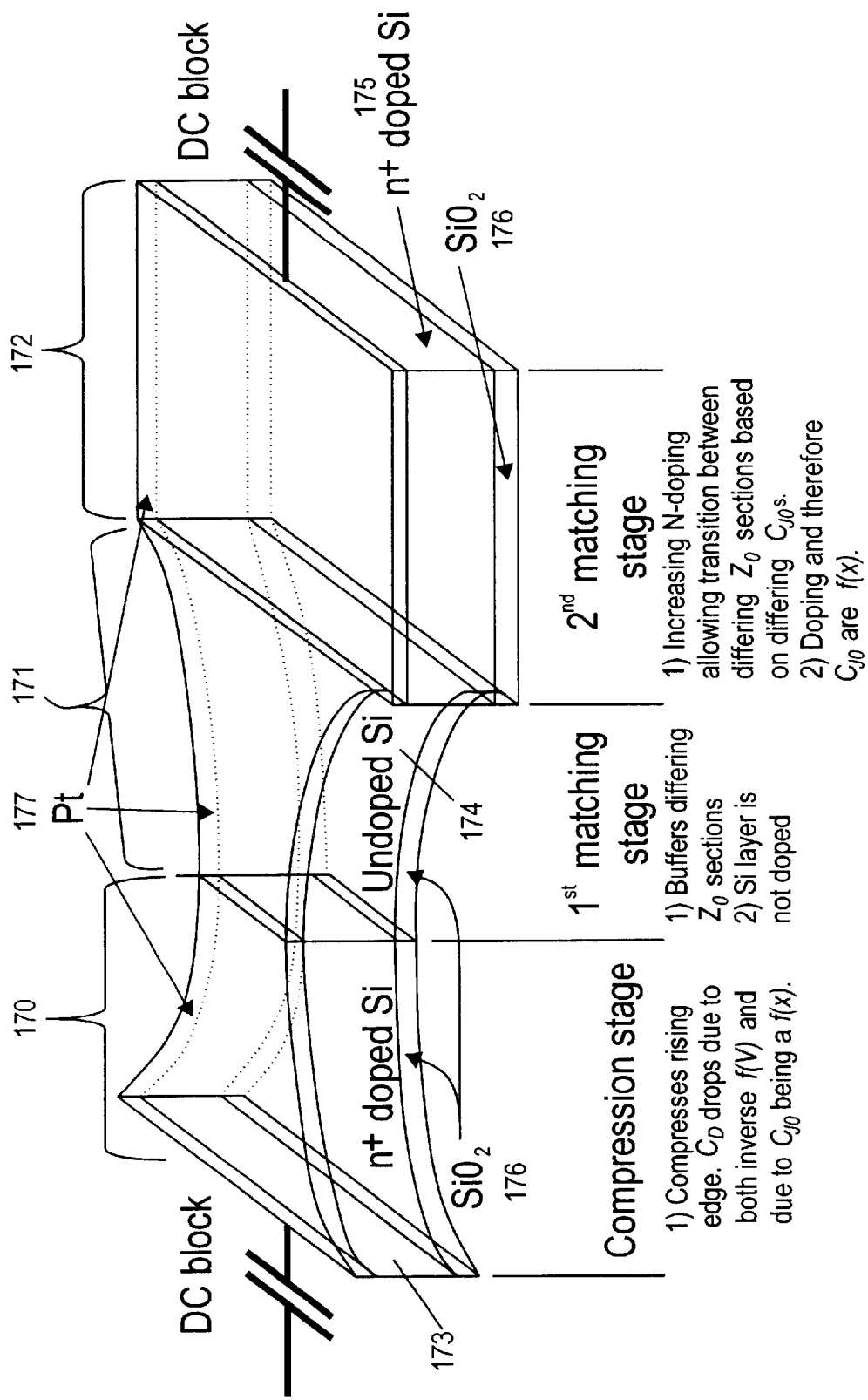
FIG. 17 is a schematic diagram of a tapered distributed diode and two transition blocks.

$C_{JO}$ can be varied by varying the thickness of the distributed diode as illustrated in FIG. 17 or alternatively by varying the doping levels of the silicon in the distributed diode.

FIG. 17 shows a tapered distributed diode 170 which is similar to the distributed diode 138 of FIG. 13 except that instead of being a rectangular block the diode is tapered towards its output end. This tapered distributed diode 170 is connected to a first transition block 171 which is in turn connected to a second transition block 172. The first and second transition blocks 171, 172 are not intended to provide active compensation to a signal, unlike the tapered distributed diode. Rather, the transition blocks 171, 172 enable the tapered distributed diode 170 to be connected to an output transmission line, taking into account the shape of the output end of the tapered distributed diode and the need to match the characteristic impedance $Z_0$ of the connected entities.

Each of the tapered distributed diode 170 and the first and second transition blocks comprise a silicon layer 173, 174, 175 whose surface is covered in a layer of platinum 177 and with a layer of silicon dioxide 176 below the silicon layer. As described above with reference to the distributed diode of FIG. 13, any suitable conducting material may be used in place of platinum and any suitable insulating material in place of the silicon dioxide layer. For the tapered distributed diode 170 the silicon layer 173 comprises N-doped silicon that is substantially evenly doped. For the first transition block, the silicon layer 174 is not doped and for the second transition block, the silicon layer 175 is. doped but the doping is graduated along the length of that block as described below.

Considering the tapered distributed diode 170, here $C_{J0}$ varies along the length of the diode i.e. from left to right in FIG. 17 because the diode is tapered along its length. $C_{J0}$ has its lowest value at the narrowest end of the tapered distributed diode 170. In FIG. 17 the tapered diode is shown as having curved edges. However, this is not essential, any suitable type of tapering may be used, with straight edges or curved edges for example. The diode should narrow towards its output end in such a manner that in use, when a signal is passed along the length of the diode, reflections and discontinuities are reduced.

As a signal pulse passes through the tapered distributed diode 170 from left to right in FIG. 17, the rising edge of the pulse is compressed for the same reasons as described in the section headed "DC biased sections of NLTL" above. For the rising edge of the pulse, $C_D$ drops because $C_D$ is an inverse function of the voltage and because $C_{J0}$ falls with distance along the tapered diode. This means that the bottom segment of the rising edge propagates more slowly than the top segment which allows the top segment to "catch up". Thus the leading edge is compressed by virtue of a reduction of the time interval T (see FIG. 3).

Considering the falling edge of the pulse, expansion of this falling edge occurs because, as the waveform begins to return to zero, the capacitance begins to increase resulting in a longer fall-time. The top segment of falling edge propagates faster than the bottom segment such that the time interval over which the falling edge occurs increases to $T_e$. However, this effect is reduced in the case that $C_{J0}$ falls along the length of the diode. This is because the increase in the capacitance as a result of $C_D$ being inversely proportional to the voltage is offset by the fact that $C_{J0}$ falls along the length of the diode.

The first transition block 171 is also tapered but in the opposite direction to the tapered distributed diode 170. The silicon layer 174 of this first transition block is not doped so that this block does not act as a diode and does not significantly alter the form of the signal pulses. By using this first transition block 171 it is possible to connect the first transition block 171 to another entity with an input edge of a different size than the output edge of the tapered distributed diode 170 such that reflections are minimised.

The second transition block 172 has a silicon layer 175 which is N-doped with increasing amounts of N-doping along its length. As the levels of N-doping increase along the length of this second transition block, so does the value of $C_{J0}$. This counteracts the fact that $C_{J0}$ dropped along the tapered distributed diode 170 and allows a connection to a transmission line such as that which provided input to the tapered diode 170 to be made effectively. However, it is not essential to use the second transition block. The first transition block may be connected to a transmission line itself and although some discontinuity may arise this does not prevent operation of the system.

Instead of using a tapered distributed diode 170 as indicated in FIG. 17 it is possible to use a rectangular distributed diode with graduated levels of N-doping. In that situation, the first transition block 171 of FIG. 17 is not required.

The distributed diodes, and NLTL sections described above may be used in any suitable form. For example, they may be incorporated into PCB based hardware, provided in integrated circuit (IC) based hardware or provided as individually machine placeable surface mount device (SMD) packages.

In the case of PCB based hardware, a plurality of concatenated AC coupled lumped NLTL sections (or distributed diodes) may be used as described above with reference to FIG. 9. Each section of NLTL is preferably provided with a DC bias access point so that its waveshaping characteristics can be DC level controlled. The NLTL sections (or distributed diodes) may be embedded in the PCB substrate. Pulse conditioning filters (as described above) and broadband matching networks (as known in the art) may be used in conjunction with the NLTL sections (or distributed diodes) in order to minimise reflections and further condition the spectrum of the signal pulses. These components can be made up of PCB based discrete elements which can be embedded in the PCB substrate, although this is not essential.

In the case that IC-package based hardware is provided, this preferably comprises a transmit/receive pad (driver/receiver) and a gain stage. For entirely IC-based applications, the lumped NLTLs or distributed diodes may be included on a die. It is also possible to incorporate some or all of the NLTL sections, broadband matching network, and pulse conditioning filter into such a transmit/receive chip.

In the case that individually machine placeable SMD packages are provided the pulse conditioning filter, the broadband matching network and the distributed diode based NLTLs are provided as individual chips that are placed on a PCB as is known in the art.

In either the IC-package based case, the PCB-based case or the individually machine placeable SMD package case, certain parameters such as the DC-bias levels of the NLTL sections and the capacitance within the pulse conditioning filter may be controllable, for example using a micro processor or a field programmable gate array (FPGA).

Figure 18A:
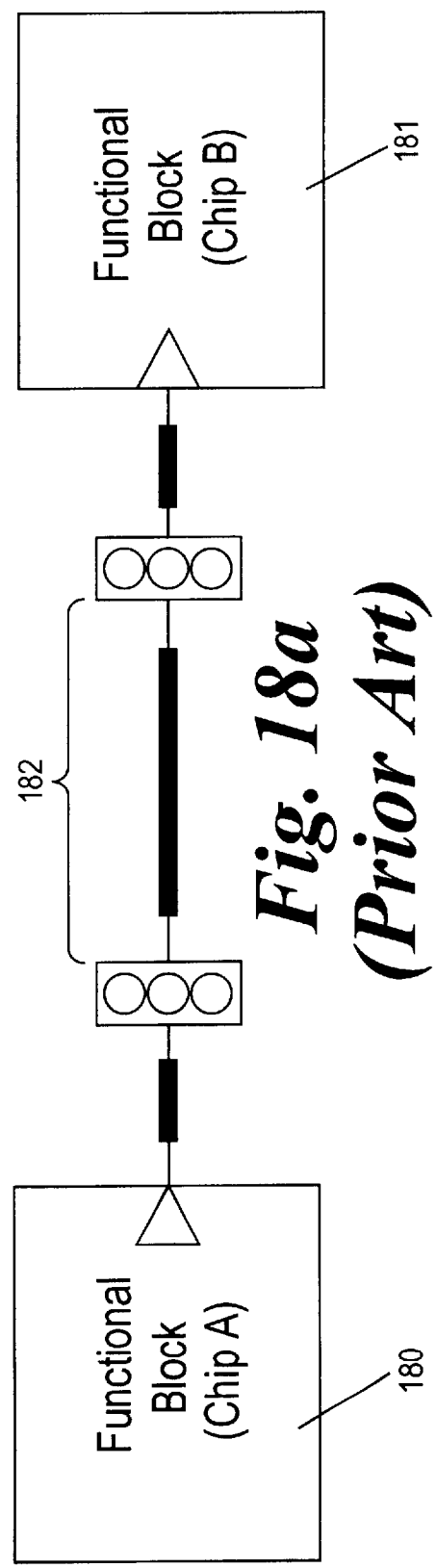
FIG. 18a is a schematic diagram of two chips connected via a back plane according to the prior art.

FIG. 18*a* is a schematic diagram of two chips 180, 181 connected via a back plane 182 according to the prior art.

Figure 18B:
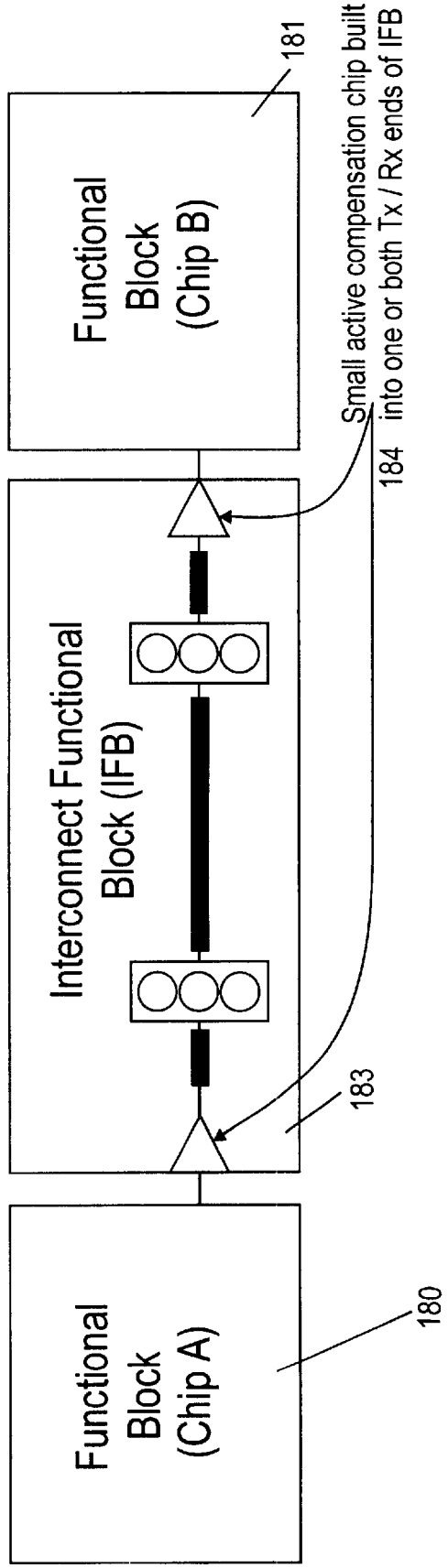
FIG. 18b is a schematic diagram of two chips connected via a back plane incorporating compensation chips.

FIG. 18*b* shows how compensation chips according to the present invention are incorporated into the arrangement of FIG. 18*a*. An interconnect functional block 183 is provided in place of the back plane connector 182 and comprises two compensation chips 184 built into one or both ends of the interconnect functional block. In one example the compensation chips comprise only a pad-driver with gain. In another example, the lumped NLTL or distribution diode, the pulse conditioning filter and the broadband matching network are all included in the compensation chip.

Any range or device value given herein may be extended or altered without losing. the effect sought, as will be apparent to the skilled person for an understanding of the teachings herein.

A range of applications are within the scope of the invention. These include situations in which it is required to improve signal integrity whilst increasing data transmission rates between two entities such as chips on a printed circuit board or back plane.

What is claimed is:

1. A voltage biased section of non-linear transmission line for use with a substantially continuous data stream and comprising:
    (i) a plurality of transmission line lengths connected together; and
    (ii) a plurality of diodes, one diode connected at each end of each transmission line length; and
    (iii) a DC voltage applied to the section of non-linear transmission line such that the section of non-linear transmission line is operable over a particular voltage range according to the value of the applied DC voltage.

2. A voltage biased section of non-linear transmission line as claimed in claim 1 wherein said transmission line lengths and said diodes are provided by a distributed diode.

3. A voltage biased section of non-linear transmission line as claimed in claim 1 wherein a first plurality of said transmission line lengths are connected in series to form a first part and a second plurality of said transmission line lengths are connected in series to form a second part; and wherein said first part is arranged to receive a voltage varying input signal and wherein said second part is at ground potential.

4. A voltage biased section of non-linear transmission line as claimed in claim 3 wherein said diodes are connected between the first and second parts and wherein said voltage is applied across said first and second parts.

5. A voltage biased section of non-linear transmission line as claimed in claim 4 which further comprises a resistor connected in series with said voltage such that the distance between the resistor and the first part is less than the distance between the voltage and the first part.

6. A voltage biased section of non-linear transmission line as claimed in claim 5 wherein the distance between the resistor and the first part is less than about 1 mm.

7. A voltage biased section of non-linear transmission line as claimed in claim 1 which further comprises a resistor connected in series with said DC voltage.

8. A non-linear transmission line for use with a substantially continuous data stream and comprising a plurality of DC voltage biased sections of non-linear transmission line connected together in series by way of capacitances.

9. A non-linear transmission line as claimed in claim 8 wherein one or more of said DC voltage biased sections of non-linear transmission line comprise a distributed diode.

10. A non-linear transmission line as claimed in claim 8 wherein said capacitances are arranged such that only time varying waveforms are able to pass through the capacitances.

11. A non-linear transmission line as claimed in claim 8 which further comprises a pulse conditioning filter connected in series to one of the sections of non-linear transmission line.

12. A non-linear transmission line as claimed in claim 8 which further comprises a feedback mechanism arranged to adjust the DC voltage biasing.

13. A printed circuit board comprising a non-linear transmission line for use with a substantially continuous data stream and comprising a plurality of DC voltage biased sections of non-linear transmission line connected together in series by way of capacitances.

14. An integrated circuit comprising a non-linear transmission line for use with a substantially continuous data stream and comprising a plurality of DC voltage biased sections of non-linear transmission line connected together in series by way of capacitances.

15. An individually machine placeable surface mount device (SMD) package comprising a non-linear transmission line for use with a substantially continuous data stream and comprising DC voltage biased sections of non-linear transmission line connected together in series by way of capacitances.

16. A signal processing device comprising two non-linear transmission lines each comprising voltage biased sections of non-linear transmission line connected together in series by way of capacitances, one of said non-linear transmission lines being arranged to process the leading edge of signal pulses and the other of said non-linear transmission lines being arranged to process the falling edge of signal pulses.

17. Method of processing a signal, comprising a succession of pulses, in order to compensate for signal degradation, said method comprising passing the signal through a DC voltage biased section of non-linear transmission line such that a particular voltage range of the pulses is subjected to pulse edge compression.

18. A method as claimed in claim 17 which further comprises passing the signal through a plurality of DC voltage biased sections of non-linear transmission line, each DC voltage biased section of non-linear transmission line having a different voltage bias, such that a different voltage range of the pulses is subjected to pulse edge compression by each section of non-linear transmission line.

19. A section of non-linear transmission line comprising:
    (i) a plurality of transmission line lengths connected together;
    (ii) a plurality of diodes, one diode connected at each end of each transmission line length; and
    (iii) an apparatus arranged to apply a DC voltage to the section of non-linear transmission line, such that in use, when the apparatus applies the DC voltage, the section of non-linear transmission line is operable over a particular voltage range according to the value of the applied DC voltage.

* * * * *